(12) United States Patent
Nguyen et al.

(10) Patent No.: US 7,781,797 B2
(45) Date of Patent: Aug. 24, 2010

(54) ONE-TRANSISTOR STATIC RANDOM ACCESS MEMORY WITH INTEGRATED VERTICAL PNPN DEVICE

(75) Inventors: Phung T. Nguyen, Pleasant Valley, NY (US); Robert C. Wong, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 326 days.

(21) Appl. No.: 11/427,406

(22) Filed: Jun. 29, 2006

(65) Prior Publication Data

US 2008/0029781 A1 Feb. 7, 2008

(51) Int. Cl.
*H01L 29/74* (2006.01)

(52) U.S. Cl. .............. 257/133; 257/330; 257/E27.098; 257/E29.211

(58) Field of Classification Search .......... 257/107, 257/110, 119, 124, E21.001, E21.002, E21.04, 257/E21.041, E21.049–E21.051, 122, 131, 257/135, 141, 162, 133, 330, E27.098, E27.099, 257/E29.211
See application file for complete search history.

(56) References Cited

U.S. PATENT DOCUMENTS

| | | | |
|---|---|---|---|
| 3,918,033 A | 11/1975 | Case et al. | |
| 4,090,254 A | 5/1978 | Ho et al. | |
| 5,276,638 A | 1/1994 | Wong | |
| 5,324,966 A * | 6/1994 | Muraoka et al. | 257/136 |
| 5,844,259 A * | 12/1998 | Kinzer et al. | 257/147 |
| 5,959,821 A * | 9/1999 | Voogel | 361/111 |
| 5,982,016 A * | 11/1999 | Pezzani et al. | 257/502 |
| 6,229,161 B1 | 5/2001 | Nemati et al. | |
| 6,545,297 B1 | 4/2003 | Noble, Jr. et al. | |
| 6,713,791 B2 | 3/2004 | Hsu et al. | |
| 6,822,294 B1 | 11/2004 | Vashchenko et al. | |
| 7,053,423 B1 * | 5/2006 | Nemati et al. | 257/107 |
| 2002/0096690 A1 * | 7/2002 | Nemati et al. | 257/133 |
| 2004/0041212 A1 | 3/2004 | Bhattacharyya | |
| 2004/0121533 A1 * | 6/2004 | Huang et al. | 438/249 |
| 2004/0262635 A1 * | 12/2004 | Lee | 257/199 |
| 2005/0001232 A1 * | 1/2005 | Bhattacharyya | 257/133 |
| 2006/0102978 A1 * | 5/2006 | Schuler et al. | 257/505 |

(Continued)

OTHER PUBLICATIONS

"Static Random Access Memory", Wikipedia, http://en.wikipedia.org/wiki/Static_random_access_memory, Apr. 12, 2006, pp. 1-4.

(Continued)

*Primary Examiner*—Lynne A Gurley
*Assistant Examiner*—Vernon P Webb
(74) *Attorney, Agent, or Firm*—Joseph Abate; Hoffman Warnick LLC

(57) ABSTRACT

A one-transistor static random access memory (1T SRAM) device and circuit implementations are disclosed. The 1T SRAM device includes a planar field effect transistor (FET) on the surface of the cell and a vertical PNPN device integrated to one side of the FET. A base of the PNP of the PNPN device is electrically common to the emitter/collector of the FET and a base of the NPN of the PNPN device is electrically common to the channel region of the FET. The anode pin of the PNPN device may be used as a word line or a bit line. A method of forming the 1T SRAM device is also disclosed.

18 Claims, 10 Drawing Sheets

U.S. PATENT DOCUMENTS

2006/0197151 A1* 9/2006 Kobayashi et al. .......... 257/341
2007/0096203 A1* 5/2007 Mouli ........................ 257/330

OTHER PUBLICATIONS

"Fairchild's Process Enhancements Eliminate the CMOS SCR Latch-Up Problem in 74 HC Logic", Fairchild Semiconductor Corporation, Application Note 339, Nov. 1987, pp. 1-9.

Nemati et al., "A Novel High Density, Low Voltage SRAM Cell with a Vertical NDR Device", Center for Integrated Systems, Stanford University, Stanford, California, 1 p.

U.S. Appl. No. 11/926,399, filed Oct. 27, 2007, Final Office Action dated Nov. 18, 2009.

* cited by examiner

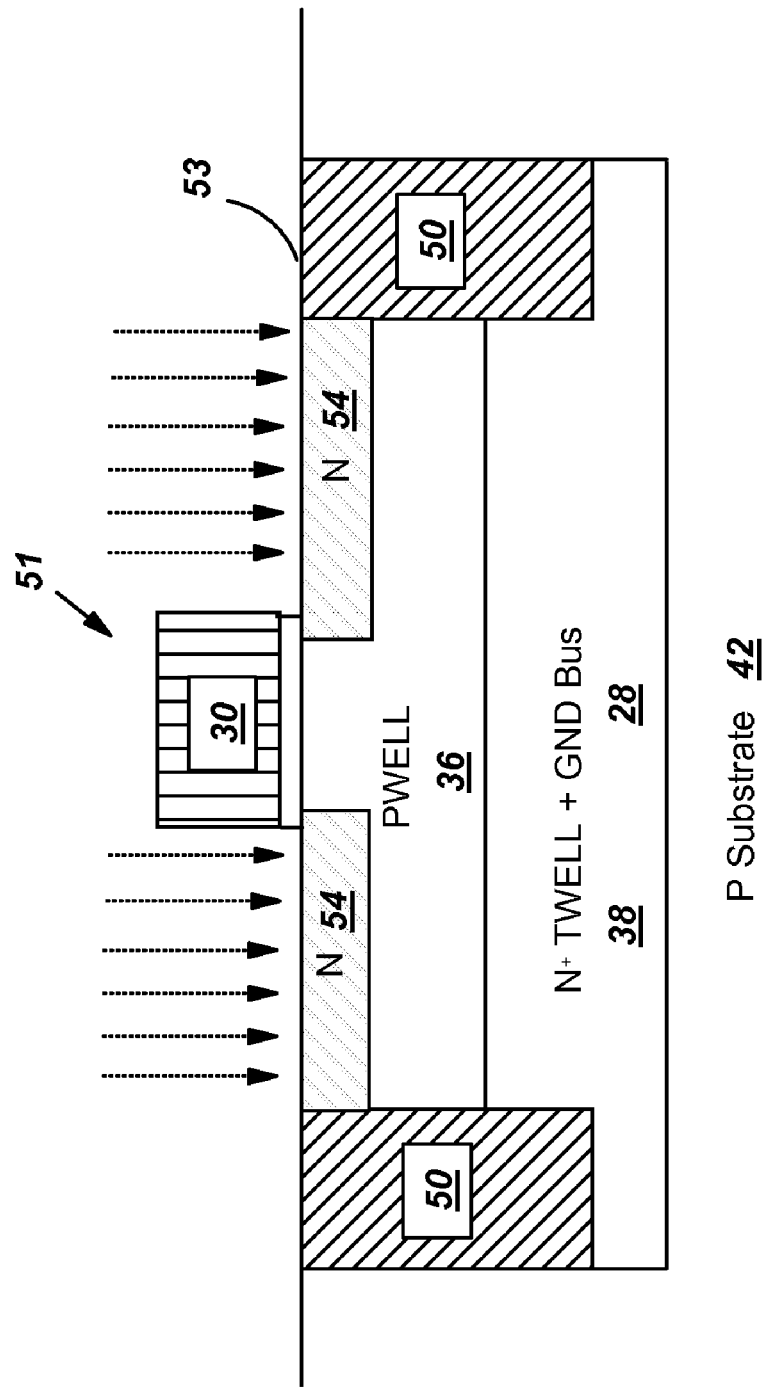

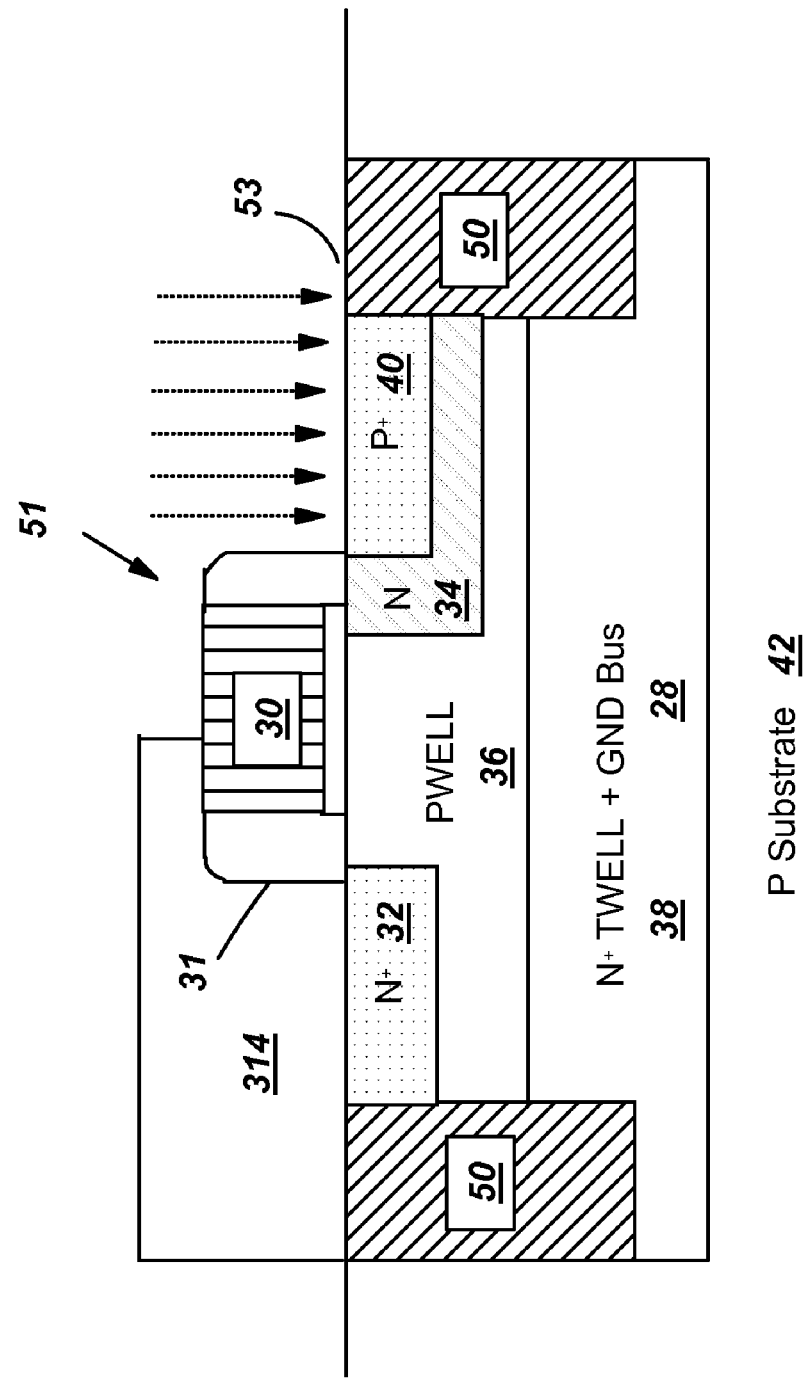

ONE-TRANSISTOR STATIC RANDOM ACCESS MEMORY WITH INTEGRATED VERTICAL PNPN DEVICE

FIELD OF THE INVENTION

The invention relates generally to a static random access memory cell, and more particularly to a device, method, and circuit implementation of a one transistor static random access memory with an integrated vertical PNPN device.

BACKGROUND ART

The dilemma between improving performance and reducing a size of semiconductor memories has long been a focus of researchers. With respect to this dilemma, the two major types of semiconductor memories, static random access memory (SRAM) and dynamic random access memory (DRAM), both have advantages and disadvantages. An SRAM can retain its data content as long as a power supply to the SRAM is maintained. However, an SRAM, typically including six field effect transistors (FET), is large in size. On the other hand, a DRAM is usually much smaller than a SRAM in size. A DRAM is disadvantageous in that the stored charge (data) on a capacitor of the DRAM is dynamic, which needs to be refreshed periodically. In addition, a DRAM is also slower than a SRAM because the single rail sensing signal of the DRAM is generated through the charge sharing between the cell node and the bit line (BL) through a thick gate access device. In contrast, the SRAM sensing signal is generated by the active thin gate n-channel field effect transistors (NFET) pulling down one of the bit line (BL) pair.

Efforts have been made to reduce the size of a SRAM. For example, there are some proposals of integrating a lateral PNPN thyristor (also referred to as a silicon controlled rectifier or SCR) into the complementary metal-oxide semiconductor (CMOS) technology to reduce cell size. However, the proposed memory with a lateral PNPN and a pass gate is not static. In addition, a lateral PNPN is difficult to fabricate and relatively large due the planar devices which cannot be implemented underneath the silicon surface. Other approaches include four transistor (4T) SRAM which does not successfully reduce the overall size of the memory cell.

In view of the foregoing, it is desirable to further reduce the size of SRAM memory cells. The present state of the art technology does not provide a satisfactory solution to this problem.

SUMMARY OF THE INVENTION

A one-transistor static random access memory (1T SRAM) device and circuit implementations are disclosed. The 1T SRAM device includes a planar field effect transistor (FET) on the surface of the cell and a vertical PNPN device integrated to one side of the FET. A base of the PNP of the PNPN device is electrically common to the drain/source of the FET and a base of the NPN of the PNPN device is electrically common to the channel region of the FET. The anode pin of the PNPN device may be used as a word line or a bit line. A method of forming the 1T SRAM device is also disclosed. Due to the integration of the FET and the PNPN device, the surface size of the 1T SRAM device is substantially reduced.

A first aspect of the invention provides a structure comprising: a planar n-channel field effect transistor (NFET) on a surface of the structure; and a vertical PNPN device integrated to the planar NFET by one side of the planar NFET.

A second aspect of the invention provides a one-transistor static random access memory (SRAM) structure comprising: a planar n-channel field effect transistor (NFET) on a surface of the structure; and a vertical PNPN device integrated to the planar NFET by one side of the planar NFET.

A third aspect of the invention provides an integrated circuit comprising: a one-transistor static random access memory (1T SRAM) device, the SRAM device including: a planar n-channel field effect transistor (NFET) on a surface of the structure; and a vertical PNPN device integrated to the planar NFET by one side of the planar NFET; wherein an emitter of the NFET is coupled to a bit line and a gate of the NFET is coupled to a word line.

A fourth aspect of the invention provides a method of forming a structure, the method comprising: forming a trench in a P type substrate; filling the trench with an insulation material; forming an N+ type triple well on the P type substrate, the N+ type triple well being doped deeper than the trench; forming an n-channel field effect transistor (NFET) on top of the triple well within an area defined by the trench, a P type channel region of the NFET being doped shallower than the trench; and forming a P type diffusion region within a first N type diffusion region of the NFET.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 5A-5F show an illustrative embodiment of a method for forming an 1T SRAM device according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
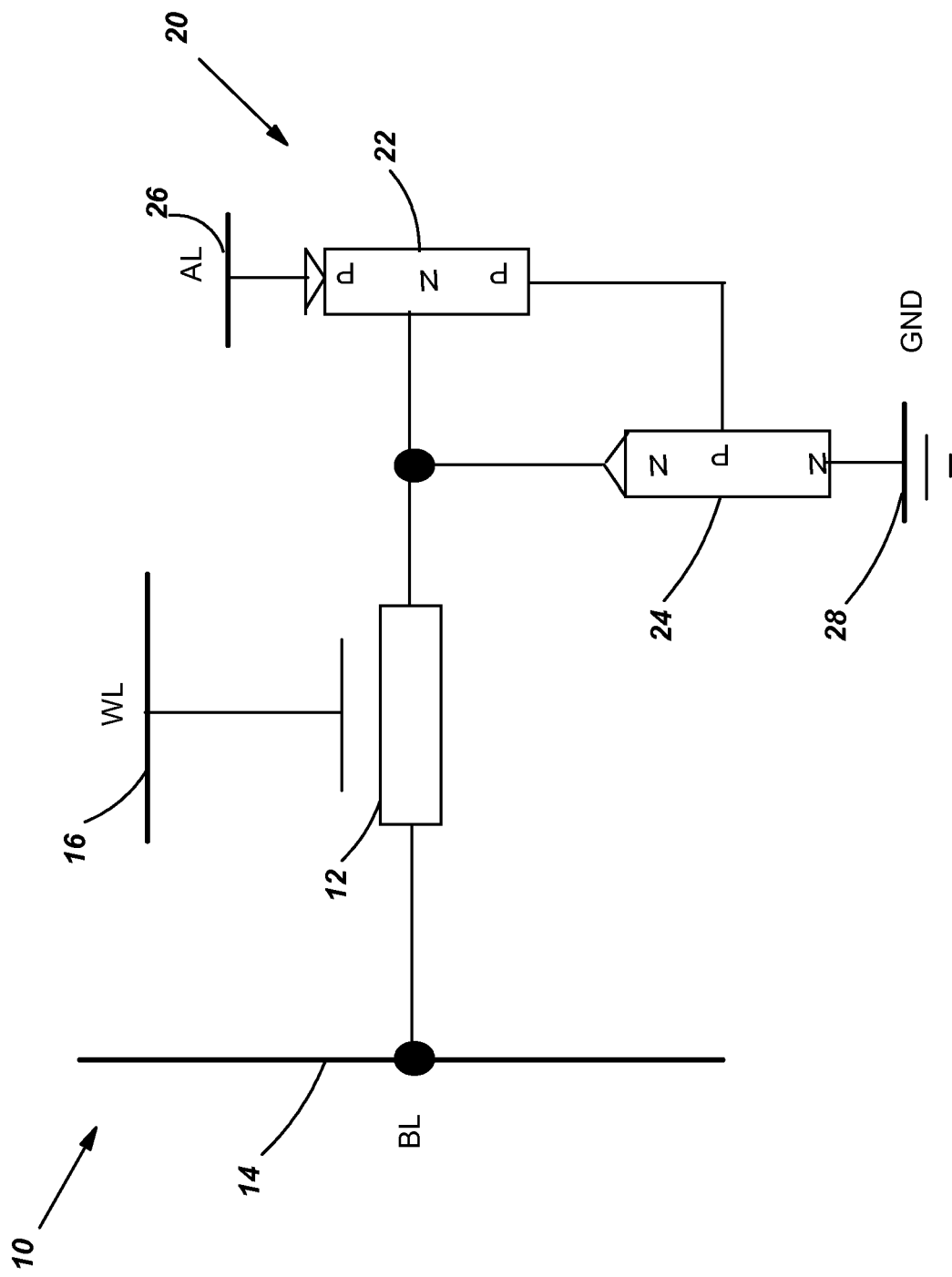
FIG. 1 shows a circuit structure of a one-transistor (1T) SRAM device according to one embodiment of the invention.

Turning to the drawings, FIG. 1 shows a circuit structure of a one-transistor SRAM 10 formed according to one embodiment of the invention. The circuit of SRAM 10 includes a planar field effect transistor (FET) 12 which is coupled to a bit line (BL) 14 and is controlled by a word line (WL) 16 to serve as an access/pass gate transistor. A vertical PNPN device (PNPN) 20 is coupled to the other side of access transistor 12. PNPN device (PNPN) 20 includes a PNP device 22 and a NPN device 24. It should be appreciated that although PNP device 22 and NPN device 24 are shown, for sake of illustration, as two separate devices, they are integrated in PNPN 20, as will be described further later. For example, the N type base of PNP device 22 is integrated to the N type collector of NPN device 24, and the P type base of NPN device 24 is integrated to the P type collector of PNP device 22. The P type base of NPN device 24 and the P type collector of PNP device 22 are also electrically common/short to a P type channel region of NFET 12. For sake of simplicity, the electrical short between the P type channel region of NFET 12 and the P type base of NPN device 24/the P type collector of PNP 22 is not shown. The anode pin of PNPN 20, i.e., the P type emitter of PNP device 22, is coupled to an anode line (AL) 26. The cathode pin of PNPN 20, i.e., the N type emitter of NPN device 24, is coupled to a ground (GND) 28.

Figure 2:
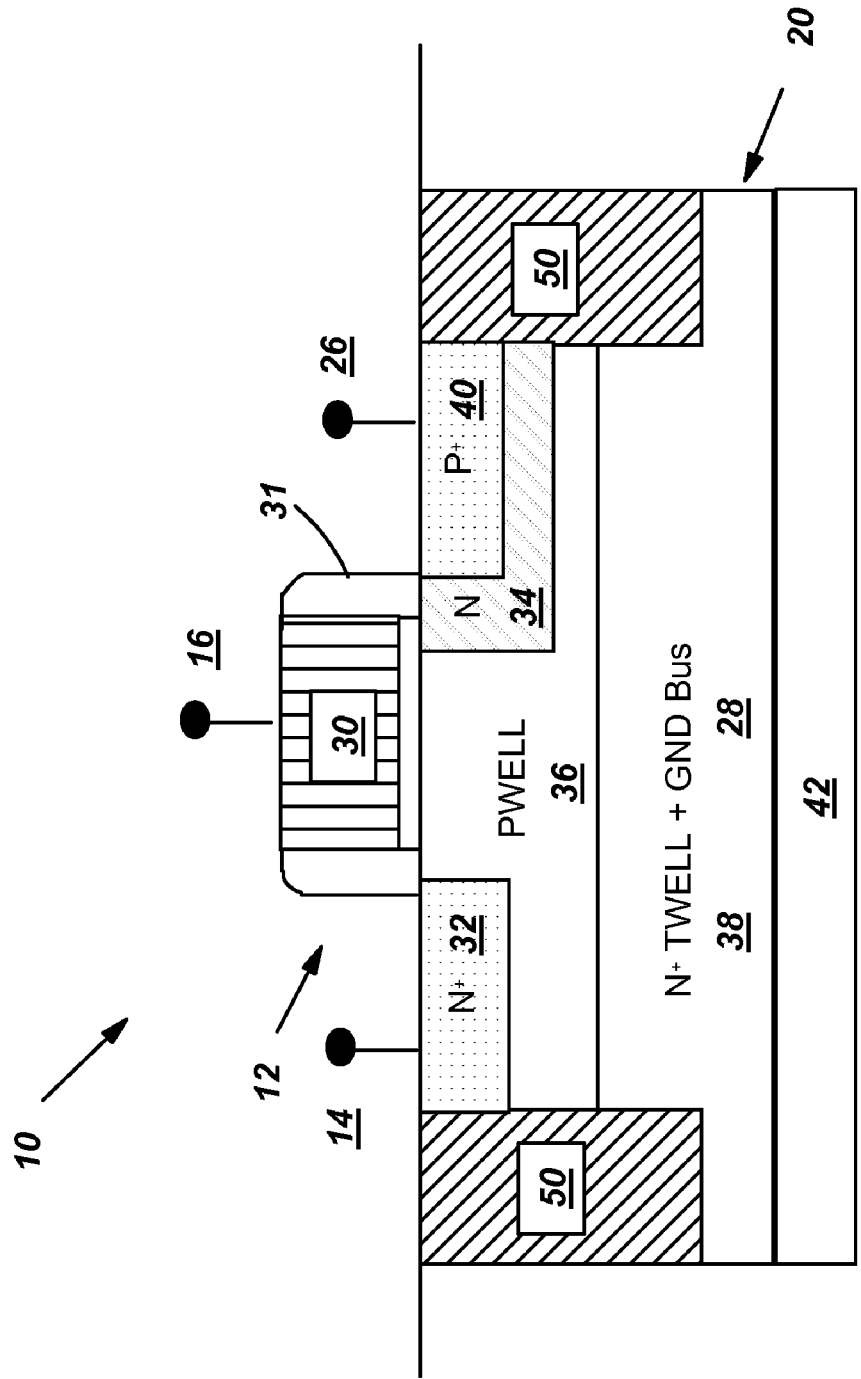
FIG. 2 shows a cross-sectional view of the 1T SRAM device of FIG. 1 according to one embodiment of the invention.

FIG. 2 shows a cross-sectional view of 1T SRAM device 10 of FIG. 1. As shown in FIG. 2, planar N channel field effect transistor (NFET) 12 is positioned on the silicon surface of 1T SRAM device 10. NFET 12 includes a gate 30 including a sidewall 31, a drain 32 ($N^+$ diffusion region), a source 34 (N diffusion region), and a P type channel region, also referred to as P type well (PWELL) 36. An $N^+$ type triple well (TWELL) 38 is positioned below PWELL 36. It is appreciated that source 34 and drain 32 of NFET 12 may be referred to interchangeably. For this specific example, diffusion region 32 is used as a drain and is coupled to bit line (BL) 14. Gate 30 is coupled to word line (WL) 16.

A $P^+$ diffusion region 40 is positioned above diffusion region (collector) 34, and is separated from PWELL 36 by diffusion region 34. 1T SRAM device 10 further includes intermediate insulation trenches (intermediate trench or IT) 50 that are positioned on/adjacent to both sides of 1T SRAM 10 to isolate layers 32, 34, 36, 40 from nearby structures. Intermediate trenches (IT) 50, however, do not isolate TWELL 38 as intermediate trenches 50 extend to a depth intermediate between a bottom line of PWELL 36 and a bottom line of TWELL 38. As such, a ground bus (GND) 28 may be integrated to TWELL 38 to eliminate the problem of putting a GND bus on the silicon surface of the cell. A P type substrate 42 is on the bottom of 1T SRAM device 10.

As shown in FIG. 2, layers/regions 40, 34, 36 and 38 constitute vertical PNPN device 20 that extends from the silicon surface to P type substrate 42 and includes in order: $P^+$ type diffusion region 40, N type diffusion region 34, PWELL 36 and TWELL 38. Specifically, layers/regions 40, 34 and 36 constitute PNP 22 (FIG. 1) and layers/regions 34, 36 and 38 constitute NPN 24 (FIG. 1). As is appreciated, layers/regions 34 and 36 each electrically perform various functions. For example, diffusion region 34 functions both as base of PNP 22 and collector of NPN 24 (FIG. 1). That is, the base of PNP 22 is electrically common/short to the collector of NPN 24. As such, N type diffusion region 34 will be referred to as diffusion region 34 for all the functions it performs, for illustrative purposes. In addition, layer 36 functions as the base of NPN 24, the collector of PNP 22 (FIG. 1), and the channel region of NFET 12. That is, the base of NPN 24, the collector of PNP 22 (FIG. 1) and the channel region of NFET 12 are electronically common to one another. For illustrative purposes, layer 36 will be referred to as PWELL 36 regarding all the functions it performs. Due to the above described integration of NFET 12 and PNPN 20, the surface size of 1T SRAM device 10 is substantially reduced.

In operation, data is retained in PNPN 20. An "ON" state of PNPN 20 (PNP 22 and NPN 24 both on) represents logic "0"; while an "OFF" state of PNPN 20 represents logic "1". Any known or later developed methods for switching PNPN on/off may be used, and all are included in the current invention. For example, PNPN 20 may be turned on by applying a current from base of NPN 24 to emitter of NPN 24. For another example, PNPN 20 may also be turned on by applying a high voltage value, e.g., 1.2 v, at anode line 26. It should be appreciated that because of the regenerative feedback effect of PNPN 20, it makes no difference whether PNP 22 or NPN 24 is first turned on. Once triggered on, PNPN 20 will remain stable in state "ON", or logic "0", as long as the product of the current gain (Beta) of PNP 22 and the current gain (Beta) of NPN 24 is greater than one.

On the other hand, when the base current from the PNP base/diffusion region 34 and to the NPN base/PWELL 36 is cut off so that the product of the current gain (Beta) of PNP 22 and the current gain (Beta) of NPN 24 becomes smaller than one, PNPN 20 will be turned off. For example, the anode current of PNPN 20 may be reduced below a value or even reversed so that PNPN 20 will be turned off when the PNP base 34 is pulled up by the BL 14 during the write '1' operation.

During a standby state of 1T SRAM 10, word line (WL) is set at GND, anode line (AL) 26 and bit line (BL) 14 are both set at a holding voltage (VH) of about 0.8. These settings are used to make a logic state of PNPN 20 stable. In the case that PNPN 20 is on, i.e., logic "0", the high anode line voltage helps maintain the product of the Beta of PNP 22 and the Beta of NPN 24 greater than 1, so that PNPN 20 will remain on. PNPN 20 in an "OFF" state, i.e., logic "1", will be stable because leakage of PNPN 20 favors the "Off" state. The mechanism is that the emitter-base junction leakage of PNP 22 with emitter 40 at VH (standby state) and the off current (Ioff) of NFET 12 will make N type diffusion region 34 float up. The emitter-base junction leakage may be also increased with a high dopant concentration, e.g., around $10^{19}$-$10^{20}$ atoms/cc or higher, at emitter/P+ diffusion region 40. At the same time, TWELL 38/GND 28 will make PWELL 36 float down because the base-emitter forward leakage of NPN 24 (FIG. 1) dominates the NPN base-collector inverse leakage. The down level is also enhanced with the broader interface between TWELL 38/GND 28 and PWELL 36. The NPN 24 (FIG. 1) base-emitter junction leakage can be further increased with Xenon implants or implants of similar elements at the interface between PWELL 36 and TWELL 38.

As such, during standby of 1T SRAM 10, voltage level of PWELL 36 depends on the data stored. PWELL 36 is about one Vbe above GND (high) for logic "0" state and around GND (low) for logic "1" state. Diffusion region 34 is low for logic "0" and high for logic "1". As a consequence, the threshold voltage of NFET 12 may vary by about 100 mv. To guarantee data retention, when PWELL is high (logic "0), the off current (Ioff) of NFET 12 must not exceed the cell direct current (DC) margin. As is appreciated, the cell DC margin depends on the current gains of the bipolar devices, i.e., PNP 22 and NPN 24 (FIG. 1), and the voltage setting at anode line 26.

During an operation of "read", WL 16 is set high, e.g., to a positive power supply (VDD), to turn on NFET 12 to float bit line (BL) 14 from the standby state of VH. In the case that PNPN 20 is on logic "1", PWELL 36 is low at GND and diffusion region 34 is high at VH, which will make bit line (BL) 14 stay high as VH or above. In the case that PNPN 20 is on logic "0", PWELL 36 is high and diffusion region 34 is low at GND, which will actively pull bit line (BL) 14 below VH. As such, the logic state of PNPN 20 can be read to bit line (BL) 14, with high voltage level (VH) of bit line (BL) 14 representing logic "1" and low voltage level (below VH) representing logic "0".

During a "write" operation, bit line (BL) 14 is set to GND to turn on PNPN 20, which represents logic "0"; bit line (BL) 14 is set VH or VDD and anode line (AL) 26 is set to GND to turn off PNPN 20, which represents logic "1". As such, bit line (BL) 14 can turn on PNPN 20 by itself, but needs the coordination of anode line (AL) 26 to turn off PNPN 20. This characteristic affects the arrangement of a memory array of 1T SRAM device 10 as will be described below.

Figure 3:
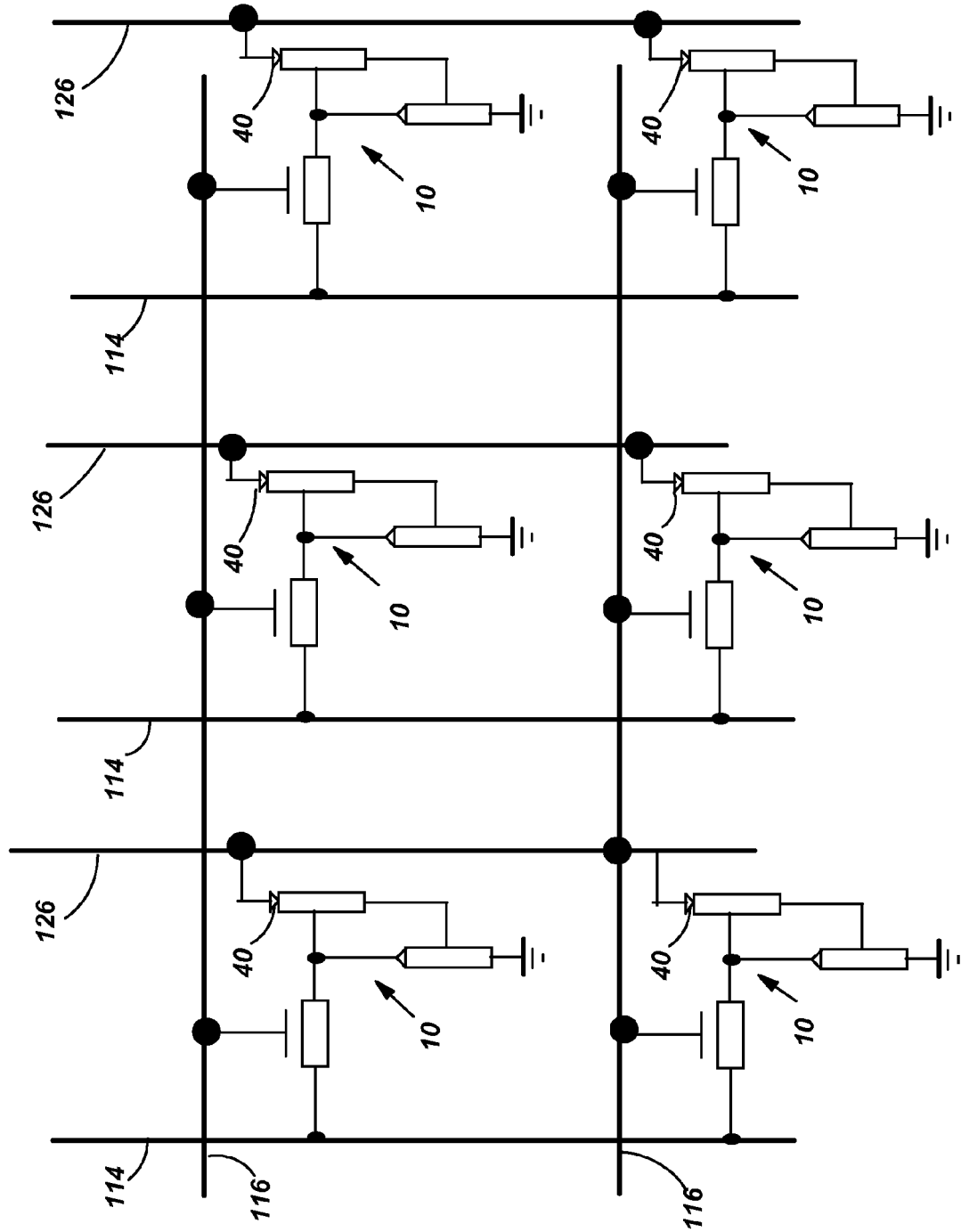
FIG. 3 shows one embodiment of arranging an array of 1T SRAM devices according to the invention.
Figure 4:
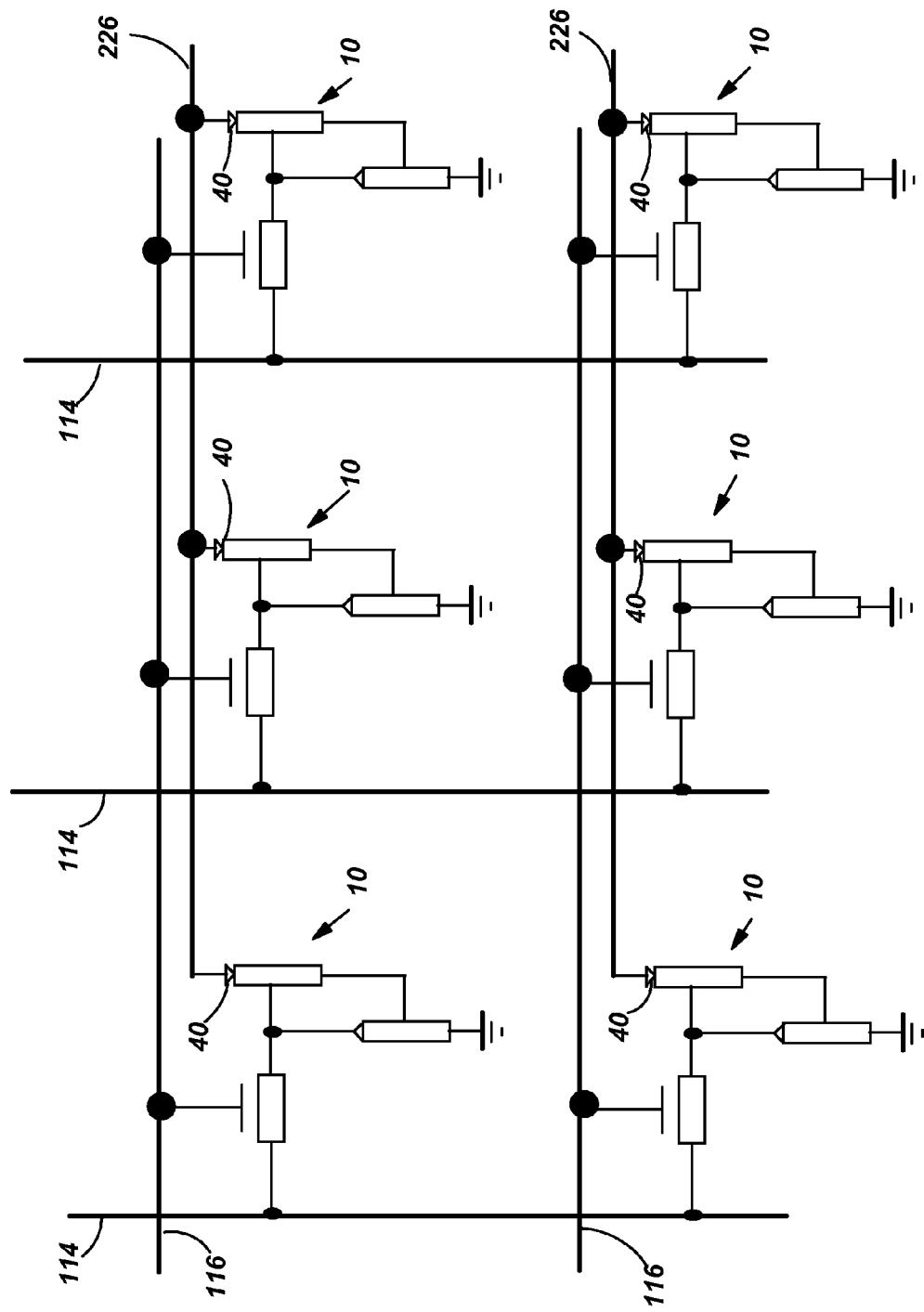
FIG. 4 shows an alternative embodiment of arranging an array of 1T SRAM devices according to the invention.

FIGS. 3-4 show two embodiments of arranging an array of 1T SRAM devices 10. In both FIGS. 3 and 4, 1T SRAM devices 10 are arranged in rows and columns. Each word line (WL) 116 selects a row of SRAM devices 10 and each bit line (BL) 114 corresponds to a column of SRAM devices 10. In FIG. 3, each anode line 126 is coupled to the PNPN anode pins 40 of a column of SRAM devices 10. As such, each anode line 126 functions as a bit line, which represents the inverse logic state of the bit line 114 corresponding to the same column of SRAM devices 10. In FIG. 4, each anode line 226 is couple to the PNPN anode pins 40 of a row of SRAM devices 10. As such, each anode line 226 functions as a word line. The embodiment of FIG. 4 requires additional actions of anode lines 226 in the selection of 1T SRAM devices 10. Specifically, an anode line 226 needs to be set from VH (standby state) to GND to select a row of 1T SRAM devices 10 for a "read" or "write" operation. As such, the array of FIG. 4 is slower in operation than that of FIG. 3. However, the array of FIG. 4 is advantageous in that it consumes less energy than that of FIG. 3.

Figure 5A:
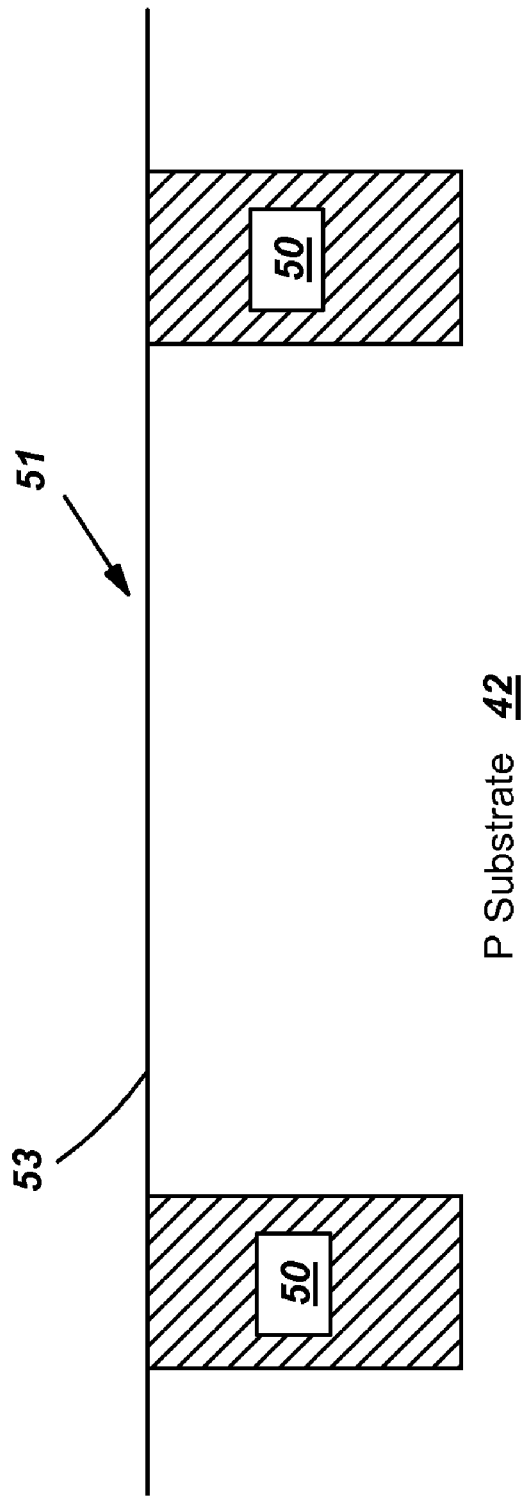

FIGS. 5A-5F show an illustrative embodiment of a method for forming 1T SRAM device 10. As shown in FIG. 5A, the process may begin with a preliminary structure of a wafer, e.g., a P type substrate 42, for implementing the invention. As a first step, two intermediate insulation trenches (intermediate trench or IT) 50 are formed on/adjacent to both sides of an active area 51 designated for 1T SRAM device 10 using any now known or later developed method. For example, a layer of nitride (not shown) may be deposited and patterned on the surface 53 of substrate 42, so that the nitride covers the designed active areas, but exposes the trench areas. Trenches 50 may be then etched and filled with an insulation material, such as silicon oxide. Silicon oxide may be deposited using any now available or later developed methods, such as a high density plasma process. The remaining nitride layer (not shown) will then be removed to expose the entire active area 51 as shown in FIG. 5A.

Figure 5B:
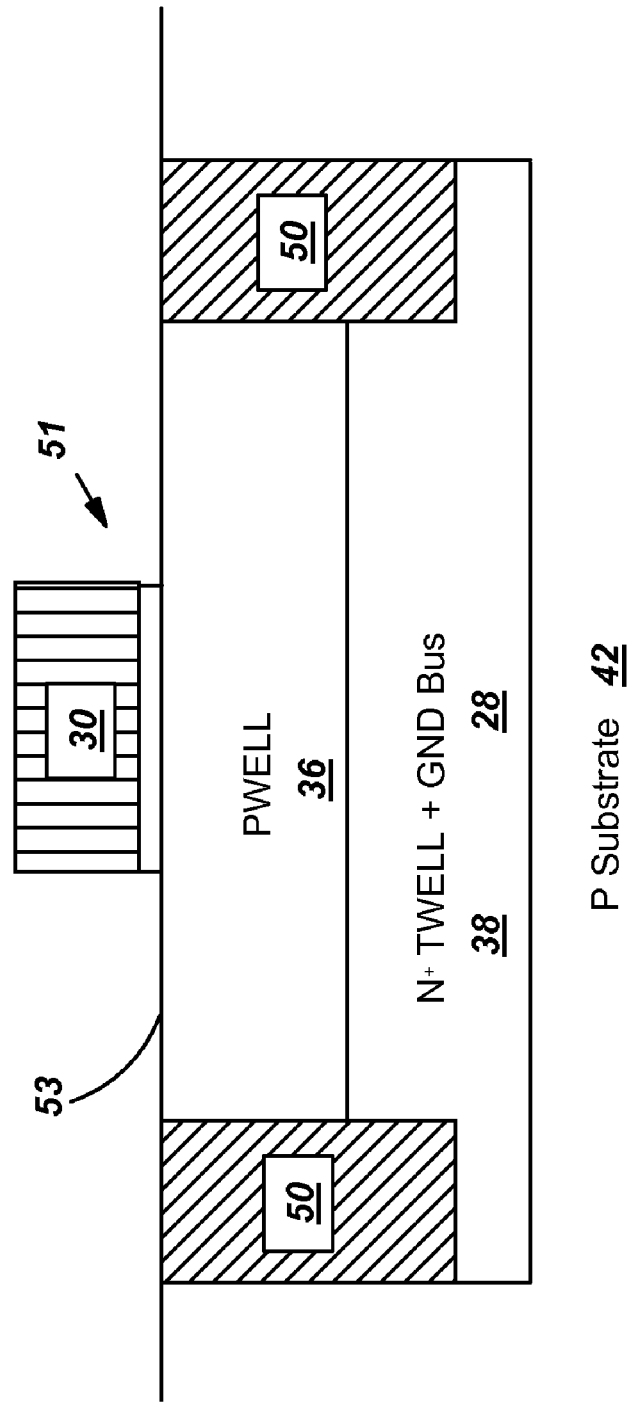

As is shown in FIG. 5B, a next step includes forming an N+ type triple well (TWELL) 38 and P type well (PWELL) 36. TWELL 38 and PWELL 36 may be formed using any methods, including the current available ion implantation or diffusion procedures. TWELL 38 needs to be deposited/doped deeper than trenches 50 so that trenches 50 do not insolate TWELL 38 from nearby structures. PWELL 36 needs to be deposited/doped shallower than trenches 50 so that trenches 50 insulate PWELL 36 from nearby structures. As such, trenches 50 are referred to as intermediate insulation trenches. Ground bus (GND) 28 may be formed within/integrated to TWELL 38. Gate 30, e.g., poly-silicon, may then be formed using any methods. It should be appreciated that some extra implants at the PWELL-TWELL interface may be needed to enhance the pull down leakage current through the base-emitter junction of NPN 24, and are included in the scope of the current invention.

As is shown in FIG. 5C, the next step includes conducting a lightly-doped-drain/source implant adjacent both sides of gate 30 and within active area 51. For example, small dope of N type dopant, e.g., phosphorous (P), arsenic (As), antimony (Sb), may be implanted adjacent both sides of gate 30, i.e., areas for source and drain, to form an intermediate layer 54.

Figure 5D:
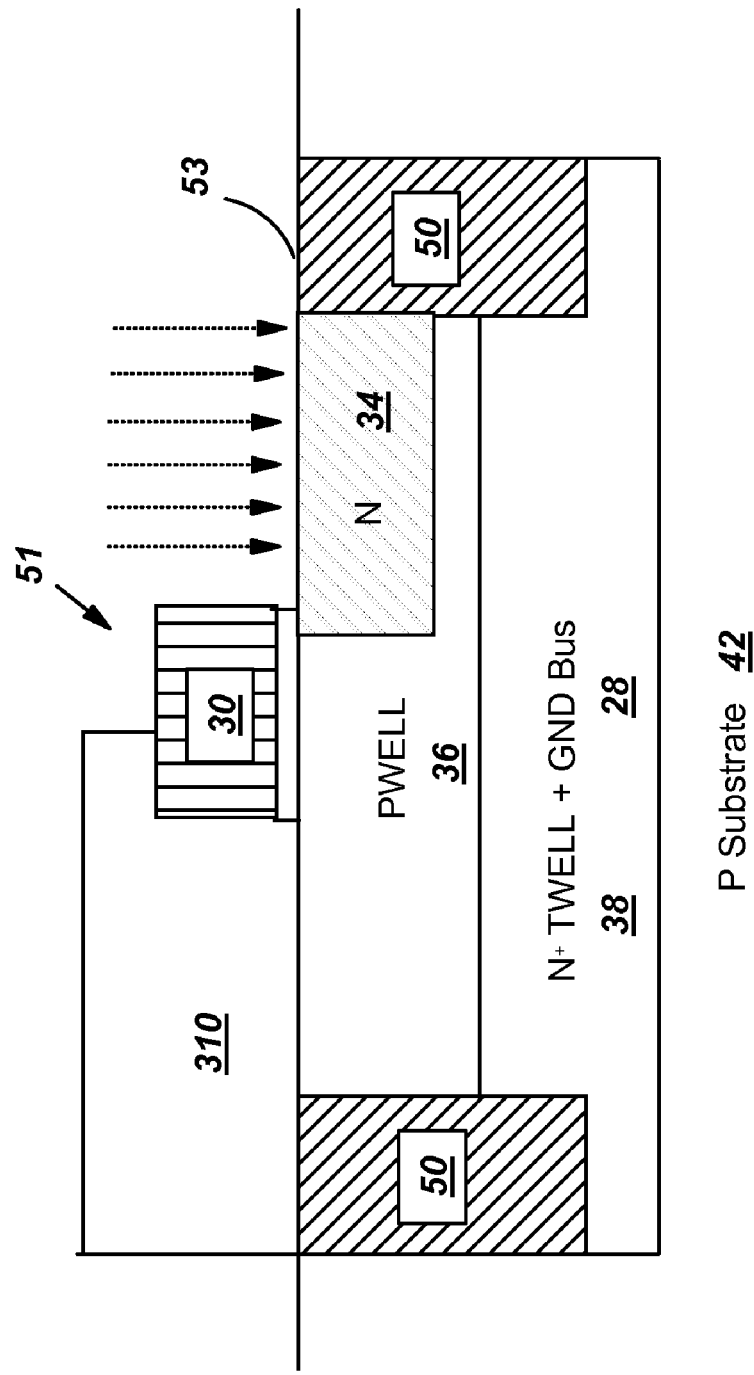

As is shown in FIG. 5D, the next step includes forming diffusion region 34 in one side of active area 51 for SRAM 10 that are defined by intermediate trenches 50. Specifically, according to one example, a mask layer 310 (e.g., photo-resist) that blocks N type dopant may be deposited and patterned to expose one side, here, e.g., the right side, of active area 51/intermediate layer 54. Diffusion region 34 may then be formed using, e.g., ion implantation of N type dopant, e.g., phosphorous (P), arsenic (As), antimony (Sb). As is appreciated, diffusion region 34 is deposited shallower than PWELL 36 and is separated from TWELL 38 by PWELL 36. As is also appreciated, diffusion region 34 is deposited deeper than intermediate layer 54, and may include part of intermediate layer 54.

Figure 5E:
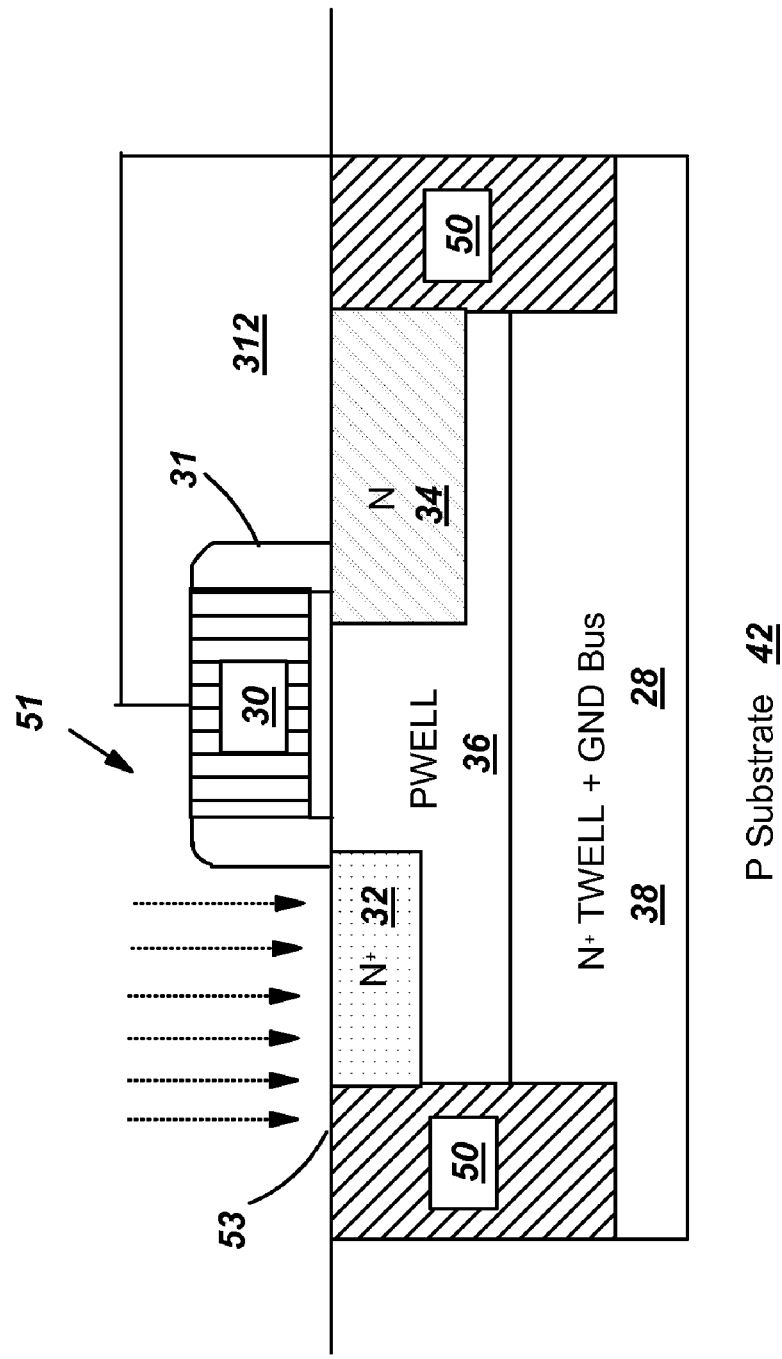

As is shown in FIG. 5E, the next step includes formation of sidewall 31 of gate 30 and source/drain 32. Specifically, according to one example, sidewall 31 is formed following/after the formation of diffusion region 34. According to one embodiment, the width of sidewall 31 is controlled with the consideration that sidewall 31 may be used as a mask to block P+ type dopant as will be described later. Next, a mask layer 312, e.g., photo-resist, that blocks N+ dopant may be deposited and patterned to expose the other side, e.g., the left side, of active area 51. Emitter/collector 32 may then be formed using, e.g., ion implantation of N+ dopant, e.g., arsenic (As). As is appreciated, source/drain 32 needs to be deposited shallower than PWELL 36. As is also appreciated, diffusion region 32 is deposited deeper than intermediate layer 54, and may include part of intermediate layer 54. It should be appreciated that other configurations are also included in the current invention.

As is shown in FIG. 5F, the next step includes forming P+ type diffusion region/emitter 40 of PNPN 20. Specifically, according to one example, a mask layer 314, e.g., photo-resist, that blocks P+ dopant may be deposited and patterned to expose the surface of diffusion region 34. Emitter 40 may then be formed above and within diffusion region 34 using ion implantation or diffusion of P+ type dopant, e.g., boron (B), indium (In) and gallium (Ga). The P+ dopant depth needs to be controlled so that emitter layer 40 does not extend beyond diffusion region 34. As described above, sidewall 31 also functions to prevent emitter 40 from extending beyond diffusion region 34. Mask layer 314 may then be removed to obtain 1T SRAM device 10 of FIG. 2. According to one embodiment, for example, the thickness of the layers/regions 40, 34, 36 and 38 of PNPN 20 (FIG. 2) are as follows: P+ diffusion region 40, 100A (0.01 mm); N type diffusion region 34, 100A (0.01 mm); PWELL 36, 100A (0.01 mm); and TWELL 38, 500A (0.05 mm). It should be appreciated that other configurations are also included in the current invention. In addition, the scope of the invention is not limited by the specific order of processing layers 34, 32, 40 as described above. Other processing orders are also included in the current invention.

It should be recognized that the above-described method is only illustrative and that other steps may also be used to generate 1T SRAM 10.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A structure comprising:
   a planar n-channel field effect transistor (NFET) on a surface of the structure; and
   a vertical PNPN device integrated to the planar NFET by one side of the planar NFET, a top P type region of the vertical PNPN device being located on the surface of the structure;

wherein a drain of the NFET is coupled to a bit line and a gate of the NFET is coupled to a word line, and wherein a source of the NFET comprises a collector of an NPN of the PNPN device and a base of a PNP of the PNPN device.

2. The structure of claim 1, wherein the vertical PNPN device includes a P+ type diffusion region on the surface of the structure, an N type diffusion region, a P type channel of the NFET (PWELL) and a N+ type triple well (TWELL).

3. The structure of claim 2, wherein the PNPN device extends from the surface of the structure to a P type substrate of the structure and includes in order: the P+ type diffusion region, the N type diffusion region, the PWELL and the TWELL.

4. The structure of claim 2, further comprising an insulation trench adjacent to a side of the structure.

5. The structure of claim 4, wherein the insulation trench separates the P+ type diffusion region, the N type diffusion region and the PWELL from a nearby structure.

6. The structure of claim 5, wherein the insulation trench extends to a depth intermediate between a bottom of the PWELL and a bottom of the TWELL.

7. The structure of claim 2, wherein the P+ type diffusion region is separated from the PWELL by the N type diffusion region.

8. The structure of claim 2, wherein a ground bus is integrated to the TWELL.

9. A one-transistor static random access memory (SRAM) structure comprising:
a planar n-channel field effect transistor (NFET) on a surface of the structure; and
a vertical PNPN device integrated to the planar NFET by one side of the planar NFET, a top P type region of the vertical PNPN device being located on the surface of the structure;
wherein a drain of the NFET is coupled to a bit line and a gate of the NFET is coupled to a word line, and wherein a source of the NFET comprises a collector of an NPN of the PNPN device and a base of a PNP of the PNPN device.

10. The SRAM structure of claim 9, wherein an N type source of the NFET is electrically common to an N type base of a PNP device of the PNPN device, the N type base also being electrically common to an N type collector of an NPN device of the PNPN device.

11. The SRAM structure of claim 9, wherein a P type channel region of the NFET is electrically common to a P type base of an NPN device of the PNPN device, the P type base also being electrically common to a collector of a PNP device of the PNPN device.

12. The SRAM structure of claim 11, further comprising an insulation trench adjacent to a side of the structure, the insulation trench separating the P type channel region and the P type base from a nearby structure.

13. The SRAM structure of claim 12, wherein the insulation trench extends to a depth intermediate between a bottom of the P type channel region and a bottom of an N+ type triple well underneath the P type channel region, the N+ type triple well being electrically common to an emitter of the NPN device.

14. An integrated circuit comprising:
a one-transistor static random access memory (1T SRAM) device, the SRAM device including:
a planar n-channel field effect transistor (NFET) on a surface of the structure; and
a vertical PNPN device integrated to the planar NFET by one side of the planar NFET, a top P type region of the vertical PNPN device being on the surface of the structure;
wherein a drain of the NFET is coupled to a bit line and a gate of the NFET is coupled to a word line, and wherein a source of the NFET comprises a collector of an NPN of the PNPN device and a base of a PNP of the PNPN device.

15. The integrated circuit of claim 14, further including multiple 1T SRAM devices arranged in a row, the word line being coupled to a gate of an NFET of each of the multiple 1T SRAM devices, wherein an anode of a vertical PNPN device of each of the multiple 1T SRAM devices is coupled to another word line.

16. The integrated circuit of claim 14, further including multiple 1T SRAM devices arranged in a column, the bit line being coupled to a drain of an NFET of each of the multiple 1T SRAM devices, wherein an anode line of a vertical PNPN device of each of the multiple 1T SRAM devices is coupled to another bit line.

17. The integrated circuit of claim 14, wherein a source of the NFET, a collector of an NPN of the PNPN device, and a base of a PNP of the PNPN device are coupled together.

18. The integrated circuit of claim 14, wherein a collector of a PNP of the PNPN device and a base of an NPN of the PNPN device are coupled together.

* * * * *